(12) United States Patent
Kato

(10) Patent No.: US 9,750,132 B2
(45) Date of Patent: Aug. 29, 2017

(54) CIRCUIT BOARD AND ELECTRONIC DEVICE

(71) Applicant: Murata Manufacturing Co., Ltd., Kyoto (JP)

(72) Inventor: Noboru Kato, Kyoto (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 277 days.

(21) Appl. No.: 14/312,977

(22) Filed: Jun. 24, 2014

(65) Prior Publication Data

US 2014/0301047 A1    Oct. 9, 2014

Related U.S. Application Data

(63) Continuation of application No. PCT/JP2013/079727, filed on Nov. 1, 2013.

(30) Foreign Application Priority Data

Dec. 25, 2012    (JP) ................................ 2012-280951

(51) Int. Cl.
*H05K 1/02*    (2006.01)
*H05K 1/14*    (2006.01)

(52) U.S. Cl.
CPC ........... *H05K 1/028* (2013.01); *H05K 1/0215* (2013.01); *H05K 1/147* (2013.01);
(Continued)

(58) Field of Classification Search
CPC ...... H05K 1/0215; H05K 1/028; H05K 1/147; H05K 2201/041; H05K 2201/0723;
(Continued)

(56) References Cited

U.S. PATENT DOCUMENTS 9,019,710 B2 * 4/2015 Jeziorek ............... H05K 3/0061
174/254
2005/0111175 A1 * 5/2005 Kim ........................ H05K 5/02
361/679.21
(Continued)

FOREIGN PATENT DOCUMENTS

JP    58-166088 U    11/1983
JP    60-57154 U    4/1985
(Continued)

OTHER PUBLICATIONS

Office Action issued in corresponding Japanese Patent Application No. 2014-518450 dated Aug. 19, 2014.
(Continued)

*Primary Examiner* — Eric Thomas
*Assistant Examiner* — Michael P McFadden
(74) *Attorney, Agent, or Firm* — Pearne & Gordon, LLP

(57) ABSTRACT

A circuit board has a flexible board with a principal surface, and a ground conductor provided in the flexible board. The flexible board is cut in at least one portion. The flexible board is bent using the cut portion, so that the flexible board has a first portion and a second portion at a different height from the first portion, and the ground conductor has a gap made by the cutting. At least one ground terminal is provided on the ground conductor near at least one end of the gap to electrically connect the circuit board to a ground provided in an external circuit.

13 Claims, 6 Drawing Sheets

(52) U.S. Cl.
CPC .................. *H05K 2201/041* (2013.01); *H05K 2201/0723* (2013.01); *H05K 2201/09063* (2013.01); *H05K 2201/1003* (2013.01); *H05K 2201/10083* (2013.01); *H05K 2201/10098* (2013.01); *H05K 2201/10303* (2013.01)

(58) Field of Classification Search
CPC . H05K 2201/09063; H05K 2201/1003; H05K 2201/10083; H05K 2201/10098; H05K 1/14; H05K 2201/1008; H05K 2201/10303
USPC ........................................... 174/254; 361/749
See application file for complete search history.

(56) References Cited

U.S. PATENT DOCUMENTS

| | | | | |
|---|---|---|---|---|
| 2010/0182529 | A1* | 7/2010 | Nakanishi | G02F 1/1336 349/58 |
| 2011/0132642 | A1* | 6/2011 | Shinoda | H05K 1/028 174/254 |
| 2012/0120619 | A1* | 5/2012 | Kodera | H05K 1/0219 361/749 |

FOREIGN PATENT DOCUMENTS

| | | |
|---|---|---|
| JP | 2001-320137 A | 11/2001 |
| JP | 2002-164626 A | 6/2002 |
| JP | 2004-104037 A | 4/2004 |
| WO | 2010/103901 A1 | 9/2010 |
| WO | 2010/131524 A1 | 11/2010 |
| WO | 2010/150588 A1 | 12/2010 |
| WO | 2011/105062 A1 | 9/2011 |

OTHER PUBLICATIONS

International Search Report issued in Application No. PCT/JP2013/079727 dated Jan. 14, 2014.

Written Opinion issued in Application No. PCT/JP2013/079727 dated Jan. 14, 2014.

Notice of Decision of Patent Grant issued in corresponding Japanese Patent Application No. 2014-518450 dated Oct. 28, 2014.

* cited by examiner

F I G. 2
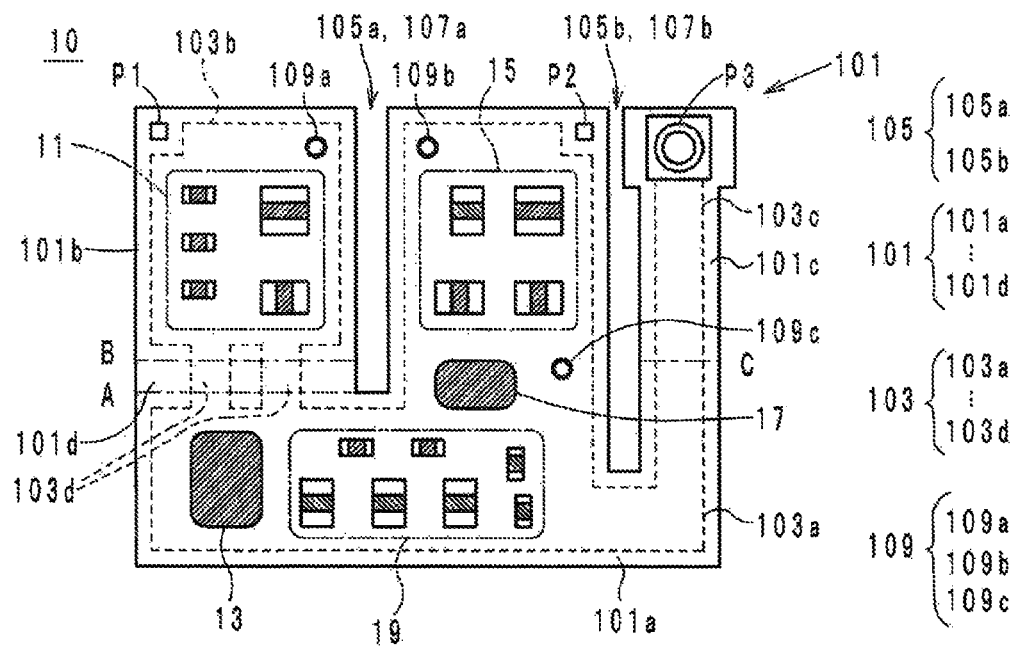
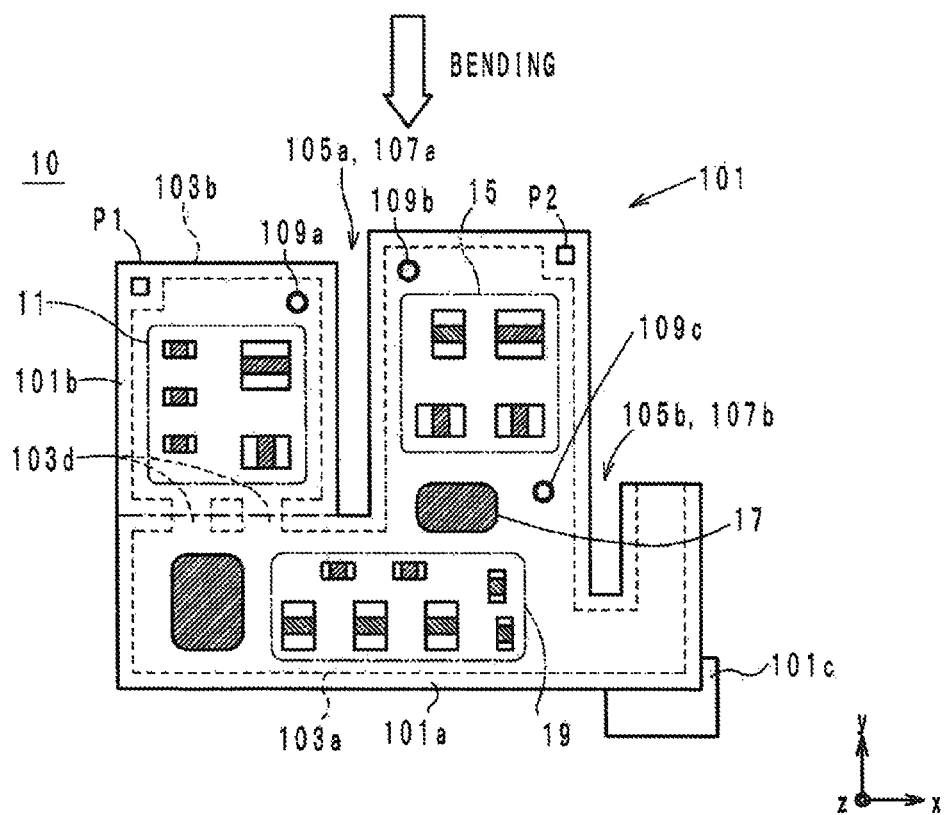

F I G. 4
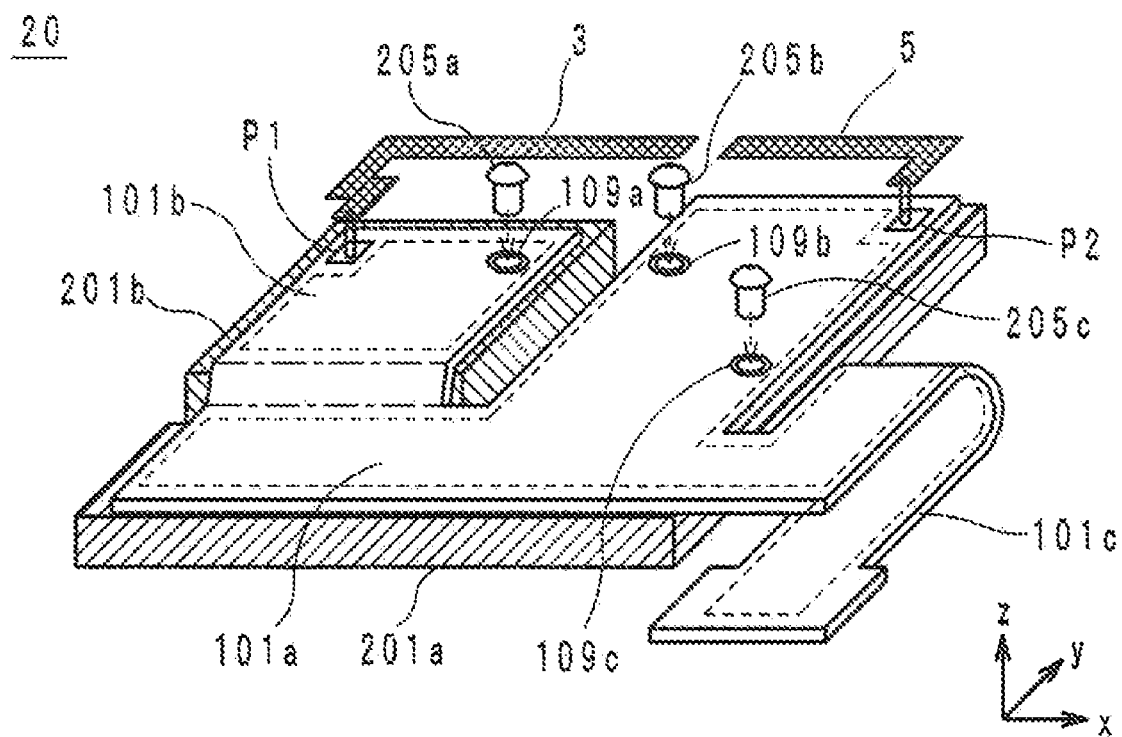

CIRCUIT BOARD AND ELECTRONIC DEVICE

This application is based on Japanese Patent Application No. 2012-280951 filed on Dec. 25, 2012 and International Application No. PCT/JP2013/079727 filed on Nov. 1, 2013, the content of each of which is incorporated herein by reference.

BACKGROUND OF THE INVENTION

1. Field of the Invention

The present invention relates to a flexible circuit board with an electronic component mounted thereon and an electronic device including the same.

2. Description of Related Art

Conventional circuit boards of this type are described in, for example, International Publication Pamphlet Nos. WO2010/103901 and WO2010/131524. The circuit board described in International Publication Pamphlet No. WO2010/103901 includes a body formed by laminating board sheets made of a flexible material. The body has a mounting area in which electronic components are mounted. In addition, the body has attachment areas intended to contact attachment members provided on an electronic device, and the attachment areas are more deformable than the mounting area. Furthermore, the body is provided with ground conductors. In one specific example of the ground conductors, the ground conductor is essentially opposite to the mounting area with at least one layer of board sheet positioned therebetween, and has a relatively large size.

Furthermore, the circuit board described in International Publication Pamphlet No. WO2010/131524 includes a body formed by laminating a plurality of insulator layers made of a flexible material. The body includes a first board section and a second board section less deformable than the first board section. The first board section is provided with coil conductors for constituting an antenna coil. The second board section has wiring conductors electrically connected to the antenna coil, and also has an electronic component (typically, an integrated circuit) electrically connected to the wiring conductors. The body is also provided with a ground conductor. The ground conductor is a relatively large-sized conductor formed between two insulator layers that are adjacent to each other in the direction of lamination.

Incidentally, various components and modules are integrated in high density within the housing of an electronic device (typically, a smartphone). Accordingly, to place the circuit board 501 in such a housing, in some cases, the circuit board 501 is structured three-dimensionally, as shown in FIG. 7. More specifically, the circuit board 501 has cuts 502a and 502b, which are made where necessary before the circuit board 501 is bent at predetermined positions 503a and 503b in accordance with a spatial shape in which it is to be placed.

However, the circuit board 501 has ground conductors 504a, 504b, and 504c occupying large areas thereof, as described above. The ground conductor 504c is positioned next to the ground conductor 504b with the cut 502b provided therebetween. The ground conductor 504b is a ground conductor positioned in an area where the circuit board 501 is not bent. As in the case of the circuit board 501, the ground conductors 504b and 504c are bent after they are cut. As a result, in some cases, the ground conductors 504b and 504c have a slit portion 505b provided therebetween so as to correspond to the cut 502b. Moreover, the ground conductor 504a is positioned next to the ground conductor 504b with the cut 502a provided therebetween. The ground conductor 504a is cut and bent, so that a slit portion 505a corresponding to the cut 502a is provided between the ground conductors 504a and 504b.

The slit portions 505a and 505b act like slots in a slot antenna during the operation of the electronic device, depending on their shape and size, resulting in problems such as noise radiation and exogenous noise reception.

SUMMARY OF THE INVENTION

A circuit board according to an embodiment of the present invention includes a flexible board having a principal surface, and a ground conductor provided in the flexible board. The flexible board is cut in at least one portion. The flexible board is bent using the cut portion, so that the flexible board has a first portion and a second portion at a different height from the first portion, and the ground conductor has a gap made by the cutting. At least one ground terminal is provided on the ground conductor near at least one end of the gap, to electrically connect the circuit board to a ground provided in an external circuit An electronic device according to another embodiment of the present invention includes the circuit board according to the above embodiment.

BRIEF DESCRIPTION OF THE DRAWINGS

FIG. 2 provides top views of the circuit board according to the embodiment;

FIG. 4 is an oblique view of a circuit board housed in an electronic device;

DETAILED DESCRIPTION OF THE PREFERRED EMBODIMENTS

Configuration of RF Front End

Figure 1:
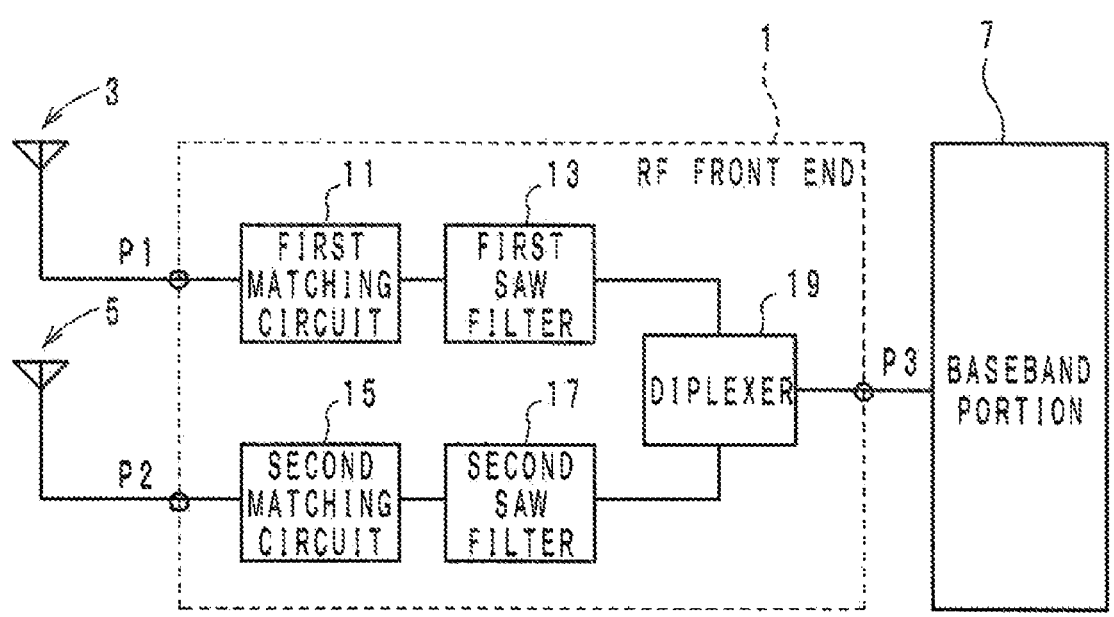
FIG. 1 is a block diagram of an RF front end to which a circuit board according to an embodiment is applied.

FIG. 1 is a block diagram illustrating the configuration of an RF front end to which a circuit board according to an embodiment of the present invention is applied. In FIG. 1, the RF front end 1 is connected to a first antenna 3, a second antenna 5, and a baseband portion 7. More specifically, the first antenna 3 is connected to a first antenna terminal P1 of the RF front end 1. The second antenna 5 is connected to a second antenna terminal P2 of the RF front end 1. The baseband portion 7 is connected to a connector P3 of the RF front end 1.

The first antenna 3 receives radio waves in a first frequency band. In a specific example, the first antenna 3 receives a 1.5-GHz band (in the case of the L1 band) high-frequency signal (also referred to below as a first high-frequency signal) transmitted from a global positioning system (GPS) satellite. The received signal is outputted to the RF front end 1.

The second antenna 5 transmits/receives radio waves in a second frequency band different from the first frequency band. In a specific example, the second antenna 5 receives a 2.4-GHz band high-frequency signal (also referred to below as a second high-frequency signal) transmitted from a base unit for short-range wireless communication (typically, wireless LAN). The received signal is outputted to the RF front end 1. The antenna 5 also transmits an output signal of the RF front end 1 to the base unit.

The baseband portion 7 is, for example, an integrated circuit for processing baseband signals. In the present embodiment, the baseband portion 7 is a one-chip IC capable of processing both the first and second high-frequency signals. More specifically, the baseband portion 7 receives a first high-frequency signal via the connector P3, and converts the received signal into a baseband signal. In addition, the baseband portion 7 receives a second high-frequency signal via the connector P3, and converts the received signal into a baseband signal. The baseband portion 7 also converts a baseband signal into a second high-frequency signal and outputs the resultant signal to the connector P3.

Specifically, the RF front end 1 includes a first matching circuit 11, a first surface acoustic wave (SAW) filter 13, a second matching circuit 15, a second SAW filter 17, and a diplexer 19.

The first matching circuit 11 provides impedance matching with the first antenna 3. In the present embodiment, the first SAW filter 13 is a SAW filter for GPS, which passes and outputs a 1.5-GHz band signal to the diplexer 19.

The second matching circuit 15 provides impedance matching with the second antenna 5. In the present embodiment, the second SAW filter 17 is a SAW filter for short-range wireless communication, which passes and outputs a signal received at the second antenna 5 to the diplexer 19. The second SAW filter 17 passes and outputs a second high-frequency signal generated by the baseband portion 7 to the second matching circuit 15 for transmission.

The diplexer 19 outputs a first high-frequency signal to the baseband portion 7 via the connector P3, and is also used for switching between transmission and reception by short-range wireless communication.

Detailed Configuration of Circuit Board

Figure 3:
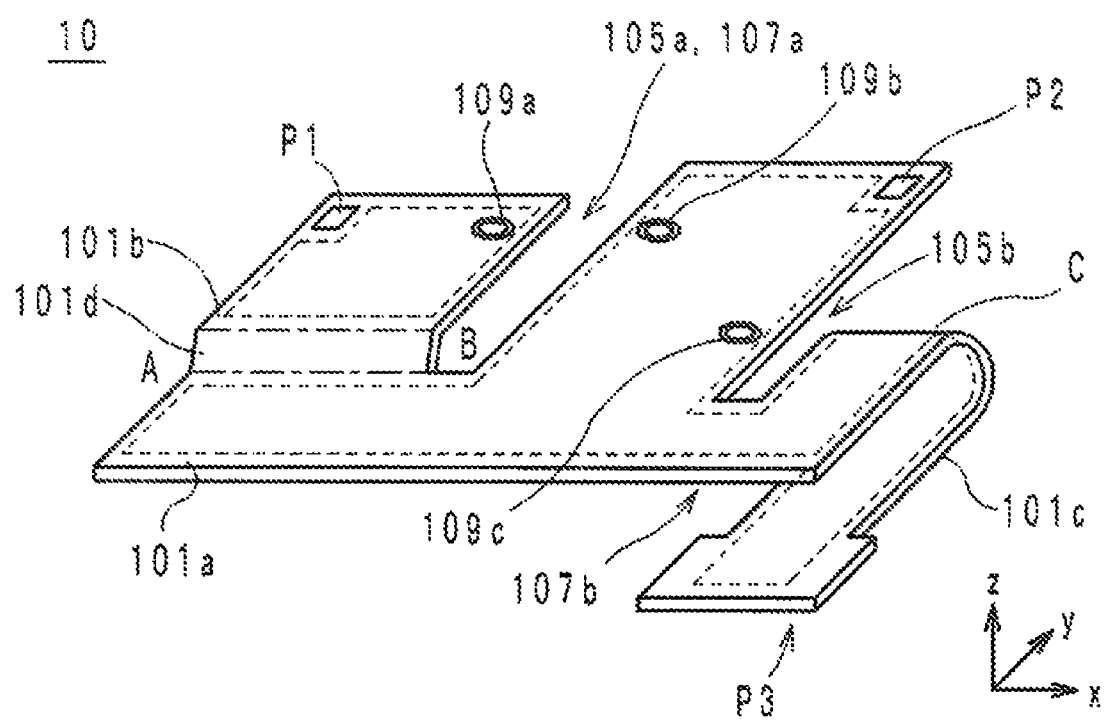
FIG. 3 is an oblique view showing essential parts of the circuit board in a bent state as shown in FIG. 2.

The configuration of the circuit board applied to the RF front end 1 thus configured will be described in detail with reference to FIGS. 2 and 3. FIG. 2 provides top views of the circuit board 10 according to the embodiment of the present invention. In FIG. 2, the upper part shows the circuit board 10 in a laid-out state, and the lower part shows the circuit board 10 in a bent state. FIG. 3 is an oblique view showing essential parts of the circuit board 10 in a bent state as shown in FIG. 2.

FIGS. 2 and 3 show x-, y-, and z-axes. The x-, y-, and z-axes are perpendicular to one another, and represent the right-left, front-rear, and top-bottom directions, respectively, of the circuit board. In addition, the z-axis also corresponds to the direction of lamination of a plurality of flexible sheets.

The circuit board 10 includes a flexible board 101 and a ground conductor 103 provided in the flexible board 101. The flexible board 101 is a multilayer board typically formed by laminating a plurality of flexible sheets in the z-axis direction. The flexible sheets are made of a flexible material. A typical type of the flexible material is thermoplastic resin such as polyimide or liquid crystal polymer.

The flexible board 101 is approximately rectangular when it is in a laid-out state as shown in a plan view in the z-axis direction (referred to below as a top view), as in the upper part of FIG. 2. The flexible board 101 is provided with at least one cut 105 in accordance with the shape of the space in which the circuit board 10 is to be placed. In the present embodiment, two cuts 105a and 105b are provided.

The cut 105a has a linear shape extending in the y-axis direction and positioned on the negative side in the x-axis direction relative to the center of the flexible board 101 in the x-axis direction. The cut 105a is open at a first end, which is located on the positive side in the y-axis direction. On the other hand, the cut 105a is not open at a second end, which is located on the negative side in y-axis direction.

The cut 105b has a linear shape approximately parallel to the cut 105a. The cut 105b extends in the y-axis direction and is positioned on the positive side in the x-axis direction relative to the center of the flexible board 101 in the x-axis direction, more specifically, the cut 105b is positioned near the edge of the flexible board 101 on the positive side in the x-axis direction. The cut 105b is open at a first end, which is located on the positive side in the y-axis direction but not at a second end, which is located on the negative side in y-axis direction. Note that in the present embodiment, a part of a ground conductor portion 103a and a further ground conductor portion 103c are positioned on a portion of the flexible board 101 that extends in the y-axis direction and is located on the positive side in the x-axis direction relative to the cut 105b. However, this is not limiting, and in addition to the ground conductor portions, a high-frequency signal line such as a microstrip line or a tri-plate strip line may be positioned on such a portion of the flexible board 101.

Here, the flexible board 101 is bent as shown in the lower part of FIG. 2 and in FIG. 3. Imaginary lines A, B, and C shown in FIG. 2 will now be described. Imaginary line A is a line extending from the second end of the cut 105a toward the negative side in the x-axis direction. Imaginary line B is a line positioned parallel to imaginary line A and located at a predetermined distance therefrom on the positive side in the y-axis direction. Imaginary line C is a line extending from a point between the first and second ends of the cut 105b toward the positive side in the x-axis direction.

Furthermore, a portion of the flexible board 101 that is enclosed by the cuts 105a and 105b, imaginary lines A and C, and edges of the flexible board 101 will be referred to below as a first portion 101a. The first portion 101a consists essentially of one plane.

Furthermore, a portion of the flexible board 101 that is enclosed by the cut 105a, imaginary line A, and edges of the flexible board 101 are bent along imaginary line A at a predetermined angle to the first portion 101a toward the positive side in the z-axis direction. Further, a portion of the flexible board 101 that is enclosed by the cut 105a, imaginary line B, and the edges of the flexible board 101 is bent along imaginary line B so as to be parallel to the first portion 101a and extend toward the positive side in the y-axis direction. The portion enclosed by the cut 105a, imaginary line B, and the edges will be referred to below as a second portion 101b. In addition, the portion enclosed by the cut 105a, imaginary lines A and B, and the edge will be referred to as a bent portion 101d.

Furthermore, a portion of the flexible board 101 that is enclosed by the cut 105b, imaginary line C, and edges of the flexible board 101 will be referred to below as a further second portion 101c. The further second portion 101c is curved around imaginary line C such that the tip of the further second portion 101c (i.e., the end on the positive side in the y-axis) faces the first portion 101a on the negative side in the z-axis direction.

By the cutting and the bending, the first portion 101a, which is substantially flat, is formed first at the center of the flexible board 101 in the x-axis direction. In addition, the second portion 101b, which is at a different height from the first portion 101a, is formed on the negative side of the flexible board 101 in the x-axis direction. Here, the first portion 101a and the second portion 101b are connected via the bent portion 101d angled against the xy plane. Further, the further second portion 101c, which is at a different height from the first portion 101a, is formed on the positive side of the flexible board 101 in the x-axis direction.

Note that the shapes and the number of cuts 105 are not limited to the above, and can be selected appropriately in accordance with the shape of the space in which the circuit board 10 is to be placed.

The ground conductor 103 is positioned, for example, between two flexible sheets adjacent in the z-axis direction. The ground conductor 103, when viewed in a top view, is in a shape in accordance with the shape of the flexible board 101 provided with the cuts 105. More specifically, the ground conductor 103 consists of the first ground conductor portion 103a, a second ground conductor portion 103b, a further second ground conductor portion 103c, and a third ground conductor portion 103d.

The first ground conductor portion 103a is similar in shape to the first portion 101a of the flexible board 101; more specifically, the contour of the first ground conductor portion 103a is enclosed by and along the contour of the first portion 101a when viewed in a top view. However, the antenna terminal P2 is disposed in one corner of the first portion 101a, as will be described later, and therefore, the first ground conductor portion 103a is not formed on the portion where the antenna terminal P2 is disposed.

The second ground conductor portion 103b is similar in shape to the second portion 101b of the flexible board 101; more specifically, the contour of the second ground conductor portion 103b is enclosed by and along the contour of the second portion 101b when viewed in a top view. However, the antenna terminal P1 is disposed in one corner of the second portion 101b, as will be described later, and therefore, the second ground conductor portion 103b is not formed on the portion where the antenna terminal P1 is disposed.

The further second ground conductor portion 103c is similar in shape to the further second portion 101c of the flexible board 101; more specifically, the contour of the further second ground conductor portion 103c is enclosed by and almost along the contour of the further second portion 101c when viewed in a top view. However, the further second ground conductor portion 103c is connected directly to the first ground conductor portion 103a along imaginary line C, and therefore, adjoins imaginary line C when viewed in a top view.

The third ground conductor portion 103d includes a plurality of (in the figure, two) linear conductors parallel to the y-axis when viewed in a top view. More specifically, the width of each linear conductor is significantly less than the dimension of the first ground conductor portion 103a in the x-axis direction and even the dimension of the second ground conductor portion 103b in the x-axis direction. The third ground conductor portion 103d is positioned between the first ground conductor portion 103a and the second ground conductor portion 103b, so as to extend across the bent portion 101d to electrically connect the first ground conductor portion 103a and the second ground conductor portion 103b.

In the ground conductor 103 as shaped above, a first gap 107a in a slot-like shape corresponding to the shape of the cut 105a is formed between the first ground conductor portion 103a and the second ground conductor portion 103b. The first gap 107a is open at a first end, which is located on the positive side in the y-axis direction. Moreover, a second gap 107b is formed between the first ground conductor portion 103a and the further second ground conductor portion 103c.

In the circuit board 10 as described above, for example, the first antenna terminal P1, the second antenna terminal P2, the connector P3, the first matching circuit 11, the first SAW filter 13, the second matching circuit 15, the second SAW filter 17, and the diplexer 19 are disposed on the surface of the flexible board 101. These components are connected to form a predetermined electronic circuit by a plurality of land electrodes and a plurality of wiring patterns formed on the surface of the flexible board 101. Note that the land electrodes and the wiring patterns are not shown in the figures for clarity and also because they are not essential parts of the present embodiment.

The first antenna terminal P1 is disposed in one corner of the second portion 101b, as described above. In the present embodiment, the first antenna terminal P1 is positioned in the corner delimited by the edges of the second portion 101b that are located respectively on the positive side in the y-axis direction and on the negative side in the x-axis direction. The first antenna terminal P1 is connected to the first antenna 3.

The second antenna terminal P2 is disposed in one corner of the first portion 101a, as described above. In the present embodiment, the second antenna terminal P2 is positioned in the corner delimited by the edges of the first portion 101a that are located respectively on the positive side in the y-axis direction and on the positive side in the x-axis direction. The second antenna terminal P2 is connected to the second antenna 5.

The connector P3 is disposed at the tip of the further second portion 101c. More specifically, the connector P3 is attached on a principal surface of the flexible board 101, which is located on the positive side in the x-axis direction when the flexible board 101 is in a laid-out state. The connector P3 is connected to the baseband portion 7.

For impedance matching with the first antenna 3, the first matching circuit 11 consists of predetermined electronic components selected from among a capacitor, an inductor, a resistor, a transistor, etc. In the present embodiment, these electronic components are mounted on the surface of the second portion 101b. Moreover, the first matching circuit 11 has an input terminal for a first high-frequency signal (GPS signal) connected to the first antenna 3 and an output terminal connected to an input terminal of the first SAW filter 13 in the subsequent stage. In addition, the first matching circuit 11 has, for example, two ground terminals electrically connected to the ground conductor 103 (more specifically, the second ground conductor portion 103b) through via-conductors (not shown) provided in the flexible board 101.

The first SAW filter 13 is mounted on the first portion 101a. Moreover, the first SAW filter 13 is connected at the input terminal to the first matching circuit 11, as described above, and at an output terminal to a first input terminal of the diplexer 19. In addition, the first SAW filter 13 has, for example, two ground terminals electrically connected to the ground conductor 103 (more specifically, the first ground conductor portion 103a).

For impedance matching with the second antenna 5, as with the first matching circuit 11, the second matching circuit 15 consists of a plurality of electronic components. In the present embodiment, these electronic components are mounted on the surface of the first portion 101a. Moreover, the second matching circuit 15 has a first input/output terminal connected to the second antenna 5 and a second input/output terminal connected to a first input/output terminal of the second SAW filter 17 in the subsequent stage. In addition, the second matching circuit 15 has, for example, two ground terminals electrically connected to the ground conductor 103 (more specifically, the first ground conductor portion 103a).

The second SAW filter 17 is mounted on the first portion 101a. Moreover, the second SAW filter 17 is connected at the first input/output terminal on the second antenna 5 side to the second matching circuit 15, as described above, and at a second input/output terminal connected to a first input/output terminal of the diplexer 19. In addition, the second SAW filter 17 has, for example, two ground terminals electrically connected to the ground conductor 103 (more specifically, the first ground conductor portion 103a).

The diplexer 19 consists of a plurality of electronic components mounted on the surface of the first portion 101a. In addition to the input terminal connected to the first SAW filter 13 and the first input/output terminal connected to the second SAW filter 17, as described above, the diplexer 19 has a second input/output terminal connected to the baseband portion 7 via the connector P3. Further, the diplexer 19 has, for example, two ground terminals electrically connected to the ground conductor 103 (more specifically, the first ground conductor portion 103a).

Furthermore, the flexible board 101 is provided with at least one ground terminal 109. In the present embodiment, three ground terminals 109, i.e., a first ground terminal 109a, a second ground terminal 109b, and a third ground terminal 109c, are provided by way of example.

The first ground terminal 109a is disposed in one corner of the second portion 101b near the open end of the first gap 107a. Here, the corner is delimited by the edges of the second portion 101b that are located respectively on the positive side in the y-axis direction and on the positive side in the x-axis direction. In this position, a through-hole is provided so as to pierce through both the second portion 101b and the second ground conductor portion 103b in the z-axis direction. A grommet made of a conductive material is inserted in the through-hole, and then swaged.

Furthermore, the second ground terminal 109b is disposed in one corner of the first portion 101a near the open end of the first gap 107a. Here, the corner is delimited by the edges of the first portion 101a that are located respectively on the positive side in the y-axis direction and on the negative side in the x-axis direction. In addition, the second ground terminal 109b is positioned so as to be opposed to the first ground terminal 109a with respect to the gap 107a. In this position, the second ground terminal 109b is provided in the same manner as the first ground terminal 109a.

The third ground terminal 109c is disposed near the edge of the first portion 101a that is located on the positive side in the x-axis direction. The third ground terminal 109c is positioned so as to be approximately aligned with imaginary line C with the second gap 107b positioned therebetween. In this position, the third ground terminal 109c is provided in the same manner as the first ground terminal 109a.

Note that the first ground terminal 109a, the second ground terminal 109b, and the third ground terminal 109c may be provided by means, such as plating, other than by swaging grommets.

Method for Producing Circuit Board

The method for producing the circuit board 10 will be described below. While the following description focuses on one circuit board 10 as an example, in actuality, large-sized flexible sheets laminated and cut, so that a number of circuit boards 10 are produced at the same time.

Prepared first are flexible sheets having their entire front faces copper-foiled. Next, via-holes are bored through predetermined flexible sheets by irradiating their bottom faces (i.e., not copper-foiled) with laser beams where via-hole conductors are to be formed.

Next, a ground conductor 103, land electrodes, and wiring patterns are formed on the front faces of predetermined flexible sheets by photolithography. Specifically, resists are printed on the copper foil on the front face of each flexible sheet in the same shapes as the above-described components. Then, any portions of the copper foil that are not coated with the resists are removed by etching the copper foil, and thereafter, the resists are removed. In this manner, the ground conductor 103, the land electrodes, and the wiring patterns are formed on the front faces of the predetermined flexible sheets.

Next, via-hole conductors are formed by filling the via-holes provided in the predetermined flexible sheets with a conductive paste mainly composed of copper.

Next, the flexible sheets are stacked so as to form a circuit board 10. The flexible sheets are then pressed from above and below for bonding. Subsequently, slits 102a and 102b are provided in the circuit board 10, and various electronic components and connectors are mounted on the circuit board 10. Thereafter, the circuit board 10 is completed by bending in the manner as described above.

Attachment to Electronic Device

Figure 5:
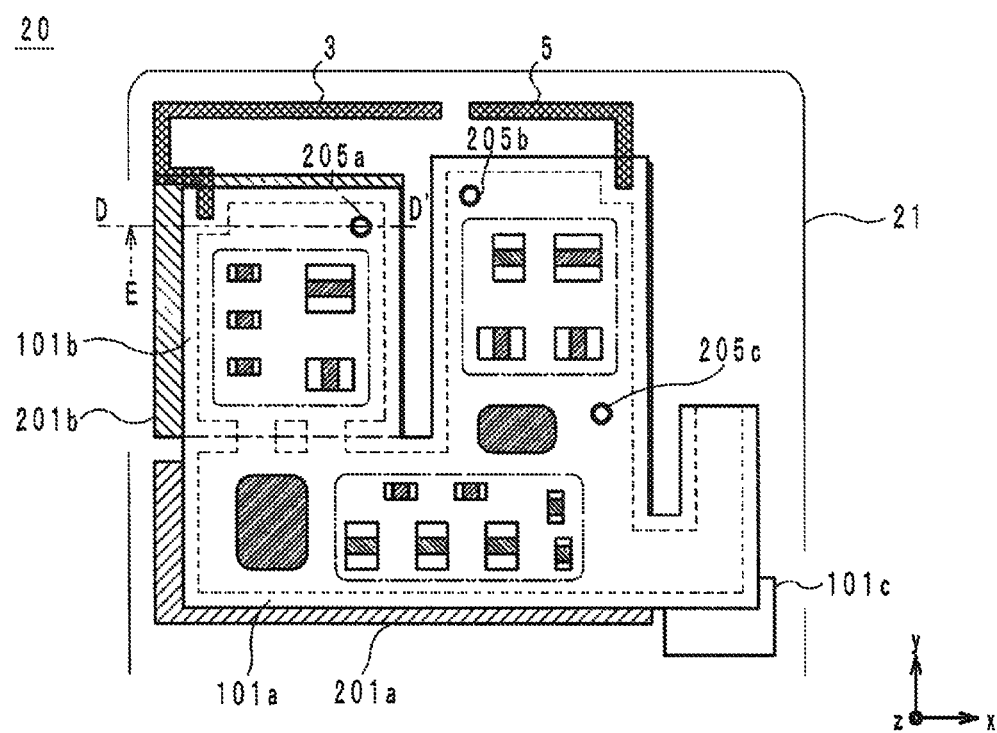
FIG. 5 is a top view of the circuit board and the electronic device in FIG. 4.
Figure 6:
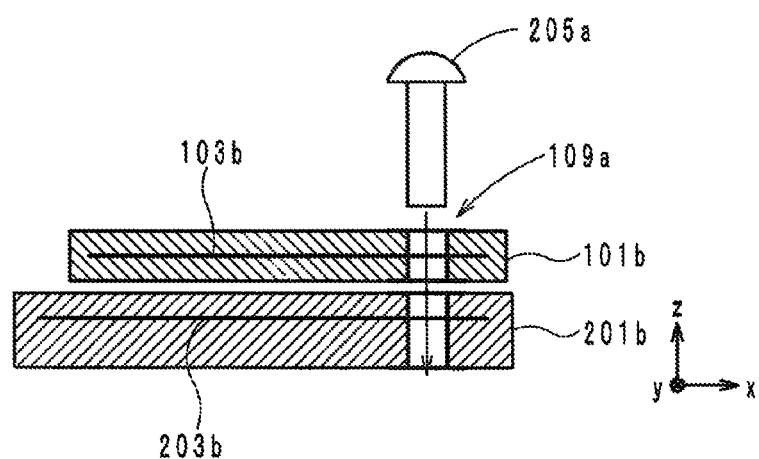
FIG. 6 is a vertical cross-sectional view of the circuit board and the electronic device taken along line D-D' of FIG. 5, as viewed in the direction of arrow E.

FIG. 4 is an oblique view of a circuit board 10 attached in a housing 21 of an electronic device 20. FIG. 5 is a top view of the circuit board 10 in FIG. 4. FIG. 6 is a vertical cross-sectional view of the circuit board 10 and the electronic device 20 taken along line D-D' of FIG. 5, as viewed in the direction of arrow E. The circuit board 10 attached in the housing 21 of the electronic device 20 will be described in detail below with reference to FIGS. 4 to 6.

As shown in FIGS. 4 and 5, various components and printed wiring boards are integrated in high density within the housing 21 of the electronic device 20. The circuit board 10 is bent after being cut, in accordance with the shape of the space in which it is set within the housing 21, as described earlier. More specifically, a second printed wiring board 201b, which is an example of an external circuit, is disposed below the second portion 101b. Here, a ground conductor 203b is provided in the second printed wiring board 201b, so as to be connected to the housing ground of the electronic device 20, as shown in FIG. 6. A conductive contact pin 205a is inserted in the first ground terminal 109a of the circuit board 10, and fixed in contact with the ground conductor 203b in the second printed wiring board 201b positioned directly therebelow.

Note that a first printed wiring board 201a, which is another example of an external circuit, is disposed below the first portion 101a, as shown in FIGS. 4 and 5. The first printed wiring board 201a also has provided therein a ground conductor plate connected to the housing ground of the electronic device 20. Conductive contact pins 205b and 205c are inserted in the ground terminals 109b and 109c of the circuit board 10 and fixed in contact with the ground conductor in the second printed wiring board 201b positioned directly therebelow. Note that in the example of FIG. 4, the conductive contact pins 205b and 205c contact the ground conductor of the second printed wiring board 201b, but instead of this, the circuit board 10 may be joined to the ground conductor of the second printed wiring board 201b by a conductive paste or solder.

Furthermore, in FIGS. 4 and 5, the first antenna 3 and the second antenna 5 are shown as being connected to the antenna terminals P1 and P2, respectively.

Actions and Effects of Circuit Board

Figure 7:
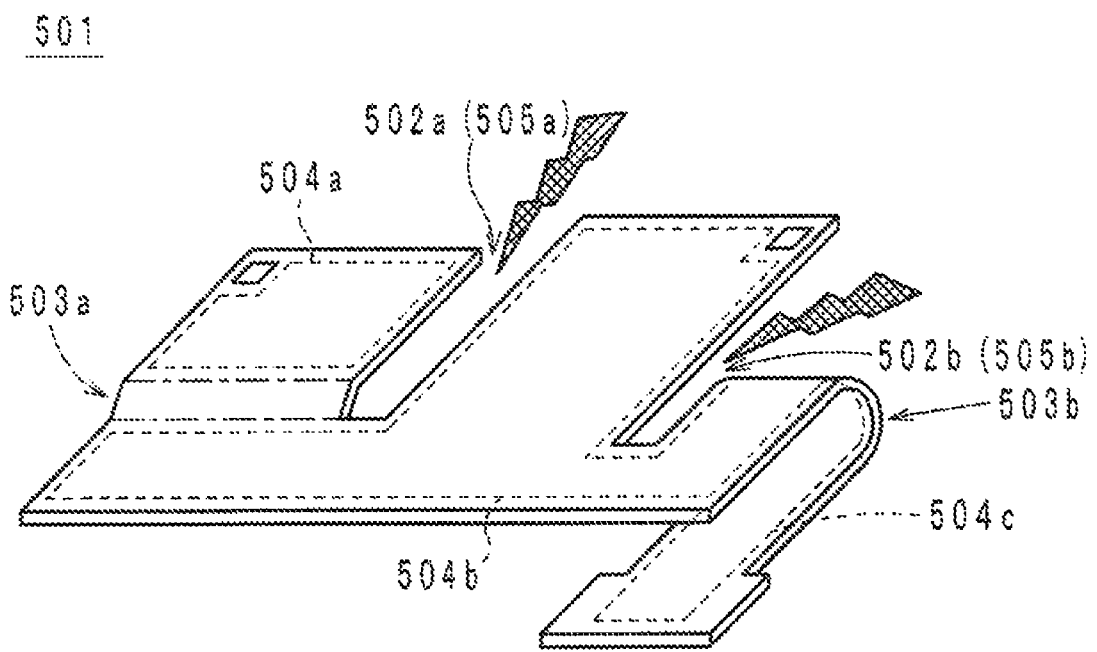
FIG. 7 is an oblique view of a conventional circuit board.

The actions and effects of the circuit board 10 attached to the electronic device 20 as described above will be described. In the conventional circuit board, the ground potential of the ground conductors 504a, 504b, and 504c (see FIG. 7) fluctuates unstably because of high-frequency currents from a number of surrounding integrated circuits, etc. As a result, the cuts 505a and 505b act like slots in a slot antenna and radiate noise or receive exogenous noise. In particular, in the case where the ground conductors 504a, 504b, and 504c differ in height in the z-axis direction (the direction of lamination), unnecessary inductance components are added to the ground conductors (in the present embodiment, the ground conductors 504a and 504c) distant from the main ground conductor (in FIG. 7, the ground conductor 504b), resulting in a relatively weak ground potential. The gap (the cut) between where the ground potential is relatively weak and where the ground potential is relatively strong is electrically unstable in a high-frequency range. In such a case, it is particularly likely that the cuts 505a and 505b act like slots in a slot antenna. In addition, there is a possible case where unnecessary resonance might occur, leading to deteriorated antenna characteristics.

On the other hand, in the present embodiment, the ground terminals 109 are provided in predetermined positions in the flexible board 101. By inserting and fixing the conductive contact pins in the ground terminals 109, the ground conductor 103 in the circuit board 10 and the ground conductor 203b in the second printed wiring board 201b of the electronic device 20 are electrically connected. Here, the ground conductor 203b is, for example, grounded to the housing, and therefore, has a relatively stable ground potential. The ground conductor 203b thus grounded is connected to the ground conductor 103 in the circuit board 10 near the gap 107a, so that the potential can be stabilized in the vicinity of the gap 107a. Thus, the gap 107a can be inhibited from act like a slot in a slot antenna, so that noise radiation and exogenous noise reception at that portion can be suppressed.

Here, in the present embodiment, as can be appreciated from, for example, FIG. 2, the ground conductor 103 in the circuit board 10 is connected to the ground conductors in the printed wiring boards 201a and 201b on opposite sides of the gap 107a. As a result, the potential of the ground conductor 103 is stabilized on both sides of the gap 107a. Thus, it is rendered possible to more effectively suppress noise radiation and exogenous noise reception.

Here, in the present embodiment, the potential of the ground conductor 103 tends to be unstable particularly near the open end of the gap. Accordingly, it is more preferable that the ground conductor 103 in the circuit board 10 and the ground conductors in the printed wiring boards 201a and 201b be connected near the open end of the gap 107a in a slot-like form, as shown in, for example, FIG. 2.

Furthermore, in the present embodiment, the circuit board 10 is connected to the printed wiring boards 201a and 201b by conductive contact pins. In connecting the circuit board 10 to the printed wiring boards 201a and 201b, their electrical continuity can also be assured by soldering leads or using spring pins, rather than by using conductive contact pins. However, it is preferable to use conductive contact pins because the circuit board 10 becomes less prone to misalignment with the printed wiring boards 201a and 201b.

Incidentally, to render the circuit board 10 more bendable, it is preferable to use a plurality of linear conductor portions, as in the third ground conductor portion 103d. However, the first ground conductor portion 103a and the second ground conductor portion 103b are at different heights from each other, and therefore, they are more likely to differ in potential. As a result, more inductance components are produced in the third ground conductor portion 103d, so that magnetic-field coupling might occur between the third ground conductor portion 103d and surrounding integrated circuits, etc. In such a case, more noise is radiated from the gap 107a in a slot-like form. In view of this, it is extremely effective to suppress fluctuations in the potential of the ground conductor 103 by electrically connecting the ground conductor 103 in the circuit board 10 and the ground conductors in the printed wiring boards 201a and 201b of the electronic device 20.

Supplementary

In the above embodiment, the ground conductor 103 in the circuit board 10 has been described as being connected to the ground conductors in the printed wiring boards 201a and 201b. However, this is not limiting the scope of the embodiment, and the ground conductor 103 may be connected to other grounds, such as the housing ground.

Furthermore, in the above embodiment, the electronic device 20 is exemplified by a smartphone. However, this is not limiting the scope of the embodiment, and the electronic device 20 can be of any type, such as a tablet computer or a loudspeaker, so long as it can include the circuit board 10.

Although the present invention has been described in connection with the preferred embodiment above, it is to be noted that various changes and modifications are possible to those who are skilled in the art. Such changes and modifications are to be understood as being within the scope of the invention.

What is claimed is:
1. A circuit board comprising:
a flexible board having a principal surface; and
a ground conductor provided in the flexible board, wherein,
the flexible board includes at least one elongated cut portion extending from an edge of the flexible board,
the flexible board is bent using the at least one elongated cut portion, so that the flexible board has a first portion and a second portion at a different height from the first portion, and the ground conductor has a gap formed by the at least one elongated cut portion, and
at least one ground terminal is provided on the ground conductor at a location adjacent an edge defining an open end of the gap and positioned between the open end of the gap and a closed end of the gap, to electrically connect the circuit board to a ground provided in an external circuit,
wherein the ground conductor and the at least one ground terminal are electrically connected to each other.

2. The circuit board according to claim 1, wherein the ground terminal is connected to the ground of the external circuit by a conductive contact pin.

3. The circuit board according to claim 1, wherein,
the circuit board has the ground terminal provided in a plurality, and
the ground terminals are positioned so as be opposed to each other in the ground conductor with respect to the gap, and electrically connect the circuit board to the ground provided on the external circuit.

4. The circuit board according to claim 1, wherein,
the flexible board has a bent portion between the first portion and the second portion,
the ground conductor includes a first ground conductor portion provided in the first portion, a second ground conductor portion provided in the second portion, and a third ground conductor portion provided in the bent portion, and
a width of the third ground conductor portion is narrower than a width of either of the first ground conductor portion and the second ground conductor portion.

5. An electronic device comprising:
a housing;
a ground; and
a circuit board capable of being placed within the housing and including a flexible board having a principal surface and a ground conductor provided in the flexible board, wherein,
the flexible board includes at least one elongated cut portion extending from an edge of the flexible board,
the flexible board is bent using the at least one elongated cut portion, so that the flexible board has a first portion and a second portion at a different height from the first portion, and the ground conductor has a gap formed by the at least one elongated cut portion, and
the circuit board further includes at least one ground terminal provided on the ground conductor at a location adjacent an edge defining an open end of the gap and positioned between the open end of the gap and a closed end of the gap, to electrically connect the circuit board to a ground provided in the electronic device, wherein the ground conductor and the at least one ground terminal are electrically connected to each other.

6. The circuit board according to claim 1, the ground conductor comprising a first ground conductor portion provided in the first portion and a second ground conductor portion provided in the second portion, wherein the gap is provided between the first ground conductor portion and the second ground conductor portion, and the gap has a slot-like shape corresponding to the shape of the cut.

7. The circuit board according to claim 5, wherein the ground terminal is connected to the ground of the electronic device by a conductive contact pin.

8. The circuit board according to claim 5, wherein,
the circuit board has the ground terminal provided in a plurality, and
the ground terminals are positioned so as be opposed to each other in the ground conductor with respect to the gap, and electrically connect the circuit board to the ground provided on the electronic device.

9. The circuit board according to claim 5, wherein,
the flexible board has a bent portion between the first portion and the second portion,
the ground conductor includes a first ground conductor portion provided in the first portion, a second ground conductor portion provided in the second portion, and a third ground conductor portion provided in the bent portion, and
a width of the third ground conductor portion is narrower than a width of either of the first ground conductor portion and the second ground conductor portion.

10. The circuit board according to claim 1, wherein the at least one ground terminal is a contact pad.

11. The circuit board according to claim 1, wherein the at least one ground terminal is a hole and a contact pin is disposed in the hole.

12. The circuit board according to claim 5, wherein the at least one ground terminal is a contact pad.

13. The circuit board according to claim 5, wherein the at least one ground terminal is a hole and a contact pin is disposed in the hole.

* * * * *